(12) United States Patent
Al-Haik et al.

(10) Patent No.: US 8,277,872 B1
(45) Date of Patent: Oct. 2, 2012

(54) METHODS OF MAKING MULTI-SCALE CARBON STRUCTURES

(75) Inventors: Marwan S. Al-Haik, Albuquerque, NM (US); Jonathan Phillips, Rio Rancho, NM (US); Claudia Luhrs, Rio Rancho, NM (US); Mahmoud Reda Taha, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 429 days.

(21) Appl. No.: 12/617,617

(22) Filed: Nov. 12, 2009

Related U.S. Application Data

(60) Provisional application No. 61/198,961, filed on Nov. 12, 2008.

(51) Int. Cl.
C23C 16/06 (2006.01)
C23C 16/26 (2006.01)

(52) U.S. Cl. .................. 427/112; 427/113; 427/249.3; 427/249.4

(58) Field of Classification Search .................. 427/111, 427/112, 113, 249.1, 249.3, 249.4
See application file for complete search history.

(56) References Cited

U.S. PATENT DOCUMENTS

| | | | | |
|---|---|---|---|---|
| 6,383,972 B1* | 5/2002 | Parmentier et al. | ........... | 502/180 |
| 6,444,347 B1* | 9/2002 | Ouvry et al. | .................. | 429/480 |
| 2006/0058443 A1* | 3/2006 | Ohashi et al. | ................. | 524/496 |
| 2006/0173195 A1* | 8/2006 | Hwang et al. | ................. | 548/557 |
| 2007/0009777 A1* | 1/2007 | Kono et al. | ..................... | 429/30 |
| 2007/0188067 A1* | 8/2007 | Tsukamoto et al. | .......... | 313/309 |
| 2012/0070667 A1* | 3/2012 | Malet et al. | .................. | 428/408 |

OTHER PUBLICATIONS

Lai, Chuilin, et al., "Growth of carbon nanostructures on carbonized electrospun nanofibers with palladium nanoparticles". Nanotechnology 19 (2008) 195303, pp. 1-7.*
Vajtai, R., et al., "Carbon nanotube network growth on palladium seeds." Materials Science and Engineering C 19 (2002) pp. 271-274.*
Atwater, Mark A., et al., "The production of carbon nanofibers and thin films on palladium catalysts of ethylene-oxygen mixtures". Carbon 47 (2009) pp. 2269-2280.*
Atwater, Mark A., et al., "Formation of Carbon Nanofibers and Thin Film Catalyzed by Palladium in Ethylene-Hydrogen Mixtures". J. Phys. Chem. C 2010, 114, pp. 5804-5810.*
Al-Haik, Marwan, et al., "Novel Growth of Multiscale Carbon Nanofilaments on Carbon and Glass Fibers". Nanoscience and Nanotechnology Letters, vol. 1, No. 2, 1-5, 2009.*
Semagina, N., et al., "Monodispersed Pd-nanoparticles on carbon fiber fabrics as structured catalyst for selective hydrogenation." Chemical Engineering Science, 62 (2007), pp. 5344-5348.*
Miracle, ASM Handbook, vol. 12 Composites, ASM International, Dec. 2001, no pages numbers.
Lapman, ASM Handbook, vol. 19 Fatigue and Fracture, ASM International, Dec. 1996, no page numbers.

(Continued)

Primary Examiner — Bret Chen
(74) Attorney, Agent, or Firm — MH2 Technology Law Group, LLP

(57) ABSTRACT

Methods of manufacturing a carbon structure including exposing a carbon fiber substrate to oxygen at a first predetermined temperature and activating the carbon fiber substrate by exposure to oxygen at a second predetermined temperature. A catalyst including palladium is deposited on the activated carbon fiber substrate. The deposited catalyst on the carbon fiber structure is exposed to a hydrocarbon at a third predetermined temperature to grow carbon structures thereon. The carbon structures grown can be multimodal in nature with structures that are nano-scale and/or submicron-scale.

19 Claims, 4 Drawing Sheets

OTHER PUBLICATIONS

Davis, Metals Handbook, Desk Edition, ASM International, Dec. 1998, no page numbers.

Atwater et al., The Production of Carbon NanoFibers and Thin Films on Palladium Catalysts from Ethylene-Oxygen Mixtures, CARBON 47 (2009), pp. 2269-2280, Elsevier Ltd., Apr. 22, 2009.

Baker et al., Nucleation and Growth of Carbon Deposits from the Nickel Catalyzed Decomposition of Acetylene, Journal of Catalysis, vol. 26, pp. 51-62, Jul. 1972.

Baker et al. The Formation of Filamentous Carbon, Chemistry and Physics of Carbon, vol. 14, pp. 83-165, 1978, Baker et al., Coke Formation of Metal Surfaces, American Chemical Society Symposium, Aug. 27, 1981, no page numbers.

Baker et al, Filamentous Carbon Formation over Iron Surfaces, American Chemical Society, p. 1-21, Jul. 30, 1982.

Bard et al., ElectroChemical Methods, Fundamentals and Applications, 2nd Edition, John Wiley & Sons, 2001, no page numbers.

Bernholc et al., Mechanical and Electrical Properties of Nanotubes, Annu. Rev. Mater. Res., vol. 32, pp. 347-375, Jun. 2002.

Boellaard et al. The Formation of Filamentous Carbon on Iron and Nickel Catalysts, Journal of Catalysts, vol. 96, pp. 481-490, Dec. 1985.

De Bokx et al., The Formation of Filamentous Carbon Fiber on Iron and Nickel Catalysts, Journal of Catalyts, vol. 96, pp. 468-480, Feb. 1985.

Boskovic et al, Low Temperature Synthesis of Carbon Nanofibers on Carbon Fibre Matricies, CARBON 43, (2005), pp. 2643-2648, Elsevier Ltd., Jun. 2005.

Chen et al, Plasma Torch Production of Macroscopic Carbon Nanotube Structures, CARBON 41 (2003), pp. 2555-2560, Pergamon, Jun. 2003.

Chen et al, Growth of Carbon Nanotubes on Carbon Microfibers by DC Plasma-Enhanced Chemical Vapor Deposition, Applied Physics Letters 88, pp. 1-3, American Inistitute of Physics, 2003.

Choi et al, Enhancement of Thermal and Electrical Properties of Carbon Nanotube Polymer Composites by Magnetic Field Processing, Journal of Applied Physics, vol. 94, No. 9, pp. 6034-6039, Nov. 2003.

Dean et al, Catalytic Etching of Platinum Foils and Thin Films in Hydrogen-Oxygen Mixtures, Journal of Physical Chemistry 92, pp. 5713-5738, Mar. 1988.

De Riccardis et al, Anchorage of Carbon Nanotubes Grown on Carbon Fibres, CARBON 44 (2006), pp. 671-674, Elsevier Ltd., Nov. 2005.

Dietzel et al, Analysis of Mechanical Properties of Single Wall Carbon Nanotubes Fixed at Apex by Atomic Force Microscopy, Nanotechnology 16 (2005), pp. 573-578, Institue of Physics Publishing, Jan. 2005.

Downs et al, Modification of the Surface Properties of Carbon Fibers Via the Catalytic Growth of Carbon Nanofibers, Journal Materials Research, vol. 10, No. 3, pp. 625-633, 1994.

Downs et al, Novel Carbon Fiber-Carbon Filament Structures, CARBON 29 (1991), pp. 1173-1179, Pergamon Publishing 1991.

Dupuis, The Catalyst in the CCVD of Carbon Nanotubes—A Review, Progress in Materials Science 50 (2005), pp. 929-961, Elsevier Ltd., 2005.

Ehrburger et al, Carbon as a Support for Catalysts: I, Effect of Surface Heterogeneity of Carbon on Dispersion of Platinum, Journal of Catalysis, vol. 43, pp. 61-67, Jun. 1976.

Ehrburger et al, Carbon as a Support for Catalysts: II, Size Distribution of Platinum Particles on Carbons of Different Heterogeneity Before and After Sintering, Journal of Catalysis, vol. 55, pp. 63-70, Oct. 1978.

Emmenegger et al, Carbon Nanotube Synthesized on Metallic Substrate, Applied Surface Science 162-163 (2000), pp. 452-456, Elsevier Ltd., 2000.

Garcia et al, Joining Prepeg Composite Interfaces with Aligned Carbon Nanotubes. Composites: Part A 39 (2008), pp. 1065-1070, Elsevier Ltd., Mar. 2008.

Garcia et al. Long Carbon Nanotubes Grown on the Surface of Fibers for Hybrid Composites, AIAA Journal, vol. 46, No. 6, p. 1405, Jun. 2008.

Garmestani et al, Polymer-Mediated Alignment of Carbon Nanotubes Under High Magnetic Fields, Advanced Materials 2003, vol. 15, No. 22, pp. 1918-1921, Nov. 2003.

Gavillet et al, Root-Growth Mechanism for Single-Wall Carbon Nanotubes, Physical Review Letters, vol. 87, No. 27, pp. 1-4, Dec. 31, 2001.

Gavillet et al, Microscope Mechanisms for the Catalyst Assisted Growth of Single-Wall Carbon Nanotubes, CARBON 40 (2002), pp. 1649-1663, Elsevier Science Ltd., 2002.

Gojny et al, Influence of Nano-Modification on the Mechanical and Electrical Properties of Conventional Fibre-Reinforced Composites, Composites: Part A 36 (2005), pp. 1525-1535, Elsevier Ltd., 2005.

Gojny et al, Carbon Nanotube-Reinforced Epoxy-Composites: Enhanced Stiffness and Fracture Toughness at Low Nanotube Content, Composites Science and Technology 64 (2004), pp. 2363-2371, Elsevier Ltd., 2004.

Gorga et al, Toughness Enhancements in Poly (methyl methacrylate) by Addition of Oriented Multiwall Carbon Nanotubes (Abstract of), Published in Journal of Polymer Science: Part B: Polymer Physics. vol. 42, pp. 2690-2702 (2004).

Hung et al, Processing and Tensile Characterization of Composites Composed of Carbon Nanotube-Grown Carbon Fibers, Composites: Part A 40 (2009), pp. 1299-1304, Jun. 2009.

Iljima, Helical Microtubules of Graphitic Carbon, Letters to Nature, vol. 354, pp. 56-58, Nov. 7, 1991.

Jenkins et al, Platinum Catalysts Supported on Graphitized Carbon Blackull: Characterization of the Platinum by Small Angle X-ray Scattering and Transmission Electron Microscopy, CARBON 20 (1982), pp. 185-189, Pergamon, Press Ltd., 1982.

Jin et al, Alignment of Carbon Nanotubes in a Polymer Matrix by Mechanical Stretching, Applied Physics Letters, vol. 73, No. 9, pp. 1197-1199, Aug. 31, 1996.

Ko, Raman Spectrum of Modified PAN-based Carbon Fibers During Graphitization, pp. 426-427, Publisher Unknown, Date Unknown.

Li et al, Toughness Improvement of Epoxy by Incorporating Carbon Nanotubes into the Resin, Journal of Materials Science Letters 22, 2003, pp. 791-793, Kluwer Academic Publishers, 2003.

Li et ak, Direct Spinning of Carbon Nanotubes Fibers from Chemical Vapor Deposition Synthesis, Science 304, 276 (2004), Apr. 9, 2004.

Li et al, Controlled Growth of Carbon Nanotubes on Graphite Foil by Chemical Vapor Deposition, Chemical Physics Letters 35 (2001), pp. 141-149, Elsevier science B.V., Feb. 23, 2001.

Linares-Solano et al, Platinum Catalysts Supported on Graphitized Carbon Blackul: Characterization of the Platinum by Titrations and Differential Calorimetry, CARBON 20 (1982), pp. 177-187, Pergamon Press Ltd., 1982.

Makris et al, Carbon Nanotube Growth on PAN- and Pitch-Based Carbon Fibres by HFCVD, Fullerenes, nanotubes and Carbon Nanostructures, 13: 1, pp. 383-392, Taylor & Francis, Inc., 2005.

Miyagawa et al, Thermo-physical and Impact Properties of Epoxy Nanocomposites Reinforced by Single-Wall Carbon Nanotubes, Polymer 45 (2004), pp. 5163-5170, Elsevier Ltd., 2004.

Mori et al, Characterization of Carbon Nanofibers Synthesized by Microwave Plasma CVD at Low-Temperature in a CO/AR.O2 System, Diamond & Related Materials 18 (2009), pp. 678-681, Elsevier B.V., Jan. 2009.

Mori et al, Effect of Oxygen and Hydrogen on the Low-Temperature Synthesis of Carbon Nanofibers Using a Low Temperature CO/Ar DC Plasma, Diamond & Related Materials 17 (2008), pp. 999-1002, Elsevier B.V., Mar. 2008.

Nielsen et al, Mechanisms of Carbon Formation on Nickel-Containing Catalysts, Journal of Catalysts, vol. 48, pp. 155-165, Academic Press, Inc., Jun. 1977.

Otsuka et al, Synthesis fo Carbon Nanotubes on Ni/Carbon-Fiber Catalysts Under Mild Conditions, CARBON 42 (2004), pp. 727-736, Elsevier Ltd., 2004.

Owens et al, Carbon Filament Growth on Platinum Catalysts, Journal of Physical Chemistry 1992, 96, pp. 5046-5053, American Chemical Society, 1992.

Park et al, Deposition on Iron-Nickel during Interaction with Carbon Monoxide-Hydrogen Mixtures, Journal of Catalysis 169, pp. 212-217, Academic Press, 1997.

Phillips et al, Novel Graphitic Structures by Design, Proceedings of the ASME International Mechanical Engineering Congress, Nov. 11-15, 2007, ASME 2007, no page numbers.

Philips et al, Iron Pentacarbonyl Decomposition over Grafoil, Production of Small Metallic Iron Particles, Journal of Physical Chemistry 1980, 84, pp. 1814-1822, American Chemical Society 1980.

Philips et al, Microcalorimetric Study of the Influence of Surface Chemistry on the Adsorption of Water by High Surface Area Carbons, Journal of Physical Chemistry B 2000, 104, pp. 8170-8176, American Chemcial Society 2000.

Philips et al, Graphitic Structures by Design, Langmuir 2006, 22, pp. 9694-9703, American Chemical Society 2003.

Qu et al, Carbon Microfibers Sheathed with Aligned Carbon Nanotubes: Towards Multidemensional, Multicomponent, and Multifunctional Nanomaterials, Small, pp. 1052-1059, Wiley-VCH Verlag GmBH & Co. 2006.

Reda Taha et al, Enhancing Fracture Toughness of High-Performance Carbon Fiber Cement Components, ACI Materials Journal, pp. 168-178, Mar.-Apr. 2001.

Rinzler et al, Large-Scale Purification of Single-Wall Carbon Nanotubes: Process, Product, and Characterization, Applied Physics A 67, pp. 29-37, Springer-Verlag 1998.

Rodriguez et al, Deactivation of Copper-Nickel Catalysts Due to Changes in Surface Composition, Journal of Catalysis 140, pp. 16-29, Academic Press, Inc., 1993.

Saito et al, Single-Wall Carbon Nanotubes Growing Radially from Ni Fine Particles Formed by Arc Evaporation, Japan Journal of Applied Physics, vol. 33 (1994), pp. 526-529, 1994.

Satapathy et al, Crack Toughness Behavior of Multiwalled Carbon Nanotube (MWNT)/Polycarbonate Nanocomposites, Macromolecular Rapid Communications, pp. 1246-1252, Wiley-VCN Verlag GmBH & Co. KGaA 2005.

Seo et al, Surface Characteristics of Carbon Fibers Modified by Direct Oxyfluorination, Journal of Colloid and Interface Science 330 (2009), pp. 237-242, Elsevier Inc., 2008.

Smiljanic et al, Growth of Carbon Nanotubes on Ohmicaly Heated Carbon Paper, Chemical Physics Letters 342 (2001), pp. 503-509, Elsevier Science B.V. 2001.

Sonoyama et al, Synthesis of Carbon Nanotubes on Carbon Fibers by Means of Two-Step Thermochemical Vapor Deposition, CARBON 44 (2006), pp. 1754-1761, Elsevier Ltd. 2006.

Terrones et al, Graphitic Cones in Palladium Catalysed Carbon Nanofibres, Chemical Physics Letters 343 (2001), pp. 241-250, Elsevier Science B.V. 2001.

Thostenson et al, Aligned Multi-walled Carbon Nanotube-reinforced Composites: Processing and Mechanical Characterization, Journal of Physics 35 (2002), pp. 77-80, Institute of Physics Publishing 2002.

Thorstenson et al, Carbon Nanotube/Carbon Fiber Hybrid Multiscale Composites, Journal of Applied Physics, vol. 91, No. 9, pp. 6034-6037, American Institute of Physics 2002.

Veedu et al, Multifucntional Composites Using Reinforced Laminae with Carbon-Nanotube Forests, Nature Letters, vol. 5, pp. 457-462, Nature Publishing Group Jun. 2006.

Wei et al, Thermal and Catalytic Etching Mechanisms of Metal Catalyst Reconstruction, Advances in Catalysts, vol. 41, pp. 359-421, Academic Press 1996.

Wu et al, Catalytic Etching of Platinum during Ethylene Oxidation, Journal of Physical Chemistry 1985, 89, pp. 591-600, American Chemical Society 1985.

Wu et al, Reaction-Enhanced Sintering of Platinum Thin Films During Ethylene Oxidation, Journal of AppliedPhysics, 59 (3), pp. 769-779, American Institue of Physics 1986.

Wu et al, Sintering of Silica-Supported Platinum Catlysts During Ethylene Oxidation, Journal of Catalysis, vol. 113, pp. 129-143, Academic Press, Inc. 1988.

Wu et al, Carbon Deposition on Platinum During Ethylene Oxidation, Journal of Catalysis, vol. 113, pp. 383-397, Academic Press, Inc. 1988.

Wu et al, XRD Evidence of Preferential Orientation of Platinum Crystallites on Graphite, Surface Science, vol. 184, pp. 463-482. Elsevier Science Publishers B.V., Jun. 1987.

Xia et al, Fracture Toughness of Highly Ordered Carbon Nanotube/Alumina Nanocomposites, Transactions of the ASME, vol. 126, pp. 238-244, ASME 2004.

Xia et al, Direct Observation of Toughening Mechansims in Carbon Nanotube Caramic Matrix Composites, Acta Materialia 53 (2004), pp. 931-944, Elsevier Ltd. 2004.

Yamamoto et al, Electrical and Thermal Properties of Hybrid Woven Composites Reinforced with Aligned Carbon Nanotubes. 49th AIAA/ASME/ASCE/AHS/ASC Structures, Structural Dynamics, and Materials Conference, p. 1, MIT 2008.

Zhandarov et al, Indirect Estimation of Fiber/Polymer Bond Strength and Interfacial Friction from Maximum Load Values Recorded in the Microbond and Pull-Out Tests. Part I: Local Bond Strength, Journal Adhesion Science and Technology, vol. 16, No. 9, pp. 1171-1200, VSP 2002.

Zhang et al, Impact Behavior of Polypropylene Filled with Multi-Walled Carbon Nanotubes, European Polymer Journal 43 (2007), pp. 3197-3207, Elsevier Ltd. 2007.

Zhao et al, Growth of Multi-Walled Carbon Nanotubes with Different Morphologies on Carbon Fibers, CARBON 43 (2005), pp. 663-665, Elsevier Ltd. 2004.

Zhu et al, Carbon Nanotube Growth on Carbon Fibers, Diamond and Related Materials 12 (2003), pp. 1825-1828, Elsevier B.V. 2003.

Zhu et al, Processing a Glass Fiber Reinforced Vinyl Ester Composite with Nanotube Enhancement of Interlaminar Shear Strength, Composites Science and Technology 67 (2007), pp. 1509-1517, Elsevier Ltd. 2006.

\* cited by examiner

METHODS OF MAKING MULTI-SCALE CARBON STRUCTURES

This application claims priority to U.S. Provisional Patent Application Ser. No. 61/198,961 entitled "Method for Making Multi-Scale Carbon-Carbon Structures for Use in Composites", filed on Nov. 12, 2008 and incorporated by reference herein in its entirety.

The present invention was made with Government support under Grant No. HDTRA1-08-1-0017 from the Defense Threat Reduction Agency. The U.S. Government has certain rights in this invention.

BACKGROUND AND SUMMARY

The present invention relates generally to the field of materials science, and more particularly to an article of manufacture or method of making the same including one or more methods for manufacturing a carbon nanotube or nanofilament structure on a carbon substrate as well as products and/or articles made by such a method.

In one aspect, the present invention includes a method of manufacturing a carbon structure including exposing a carbon fiber substrate to oxygen at a first predetermined temperature; and activating the carbon fiber substrate by exposure to oxygen at a second predetermined temperature. A method can also include depositing a catalyst on the carbon fiber substrate; and exposing the catalyst on the carbon fiber substrate to a hydrocarbon at a third predetermined temperature in order to grow a carbon structure thereon.

In another aspect, the present invention includes a method for generating multiscale carbon-carbon structures including exposing a polyacrylonitrile fiber substrate to oxygen at a temperature ranging between 475 and 525 degrees Celsius; and depositing a palladium nitrate catalyst on the polyacrylonitrile fiber substrate. The method can also include decomposing the nitrate thereby leaving substantially pure palladium particles; and exposing the catalyst on the polyacrylonitrile fiber substrate to a hydrocarbon at a temperature ranging between 525 and 575 degrees Celsius in order to grow a carbon structure thereon, wherein the carbon structure can be of multi- or variable-scale. As described further herein, the substantially pure palladium particles can be between 0.3 and 0.5% of the net weight of the polyacrylonitrile fiber substrate and the hydrocarbon comprises a gas mixture of nitrogen, oxygen and one of acetylene, ethylene or methane.

In another aspect, the present invention includes a method for generating multiscale carbon-carbon structures including exposing a polyacrylonitrile fiber substrate to oxygen at a temperature ranging between 475 and 525 degrees Celsius; and rinsing the polyacrylonitrile fiber substrate in a solvent. The method can further include activating the polyacrylonitrile fiber substrate by exposure to oxygen at a temperature ranging between 500 and 550 degrees Celsius; depositing a palladium catalyst on the polyacrylonitrile fiber substrate, wherein the palladium catalyst can be an aqueous solution comprising palladium nitrate; decomposing the nitrate thereby leaving substantially pure palladium particles of between 0.3% and 0.5% of the net weight of the polyacrylonitrile fiber substrate; and exposing the substantially pure palladium particles on the polyacrylonitrile fiber substrate to a gas including ethylene at a temperature ranging between 525 and 575 degrees Celsius in order to grow a carbon structure thereon.

In other aspects, the present invention can include multiscale or multi-modal carbon structures grown on carbon substrates at substantially atmospheric pressure and at temperatures below 1000 degrees Celsius. As described in further herein, the methods of the preferred and example embodiments are practicable under relatively benign conditions, including ambient pressures, low temperatures, and with relatively simple, inexpensive and scalable equipment. Other aspects and features of the present invention are described in detail with reference to the following drawings.

DETAILED DESCRIPTION

As will be appreciated by one skilled in the art, aspects of the present invention may be embodied as a method, article of manufacture or a product made according to a process specified and described herein.

I. Preferred Embodiments

Figure 1:
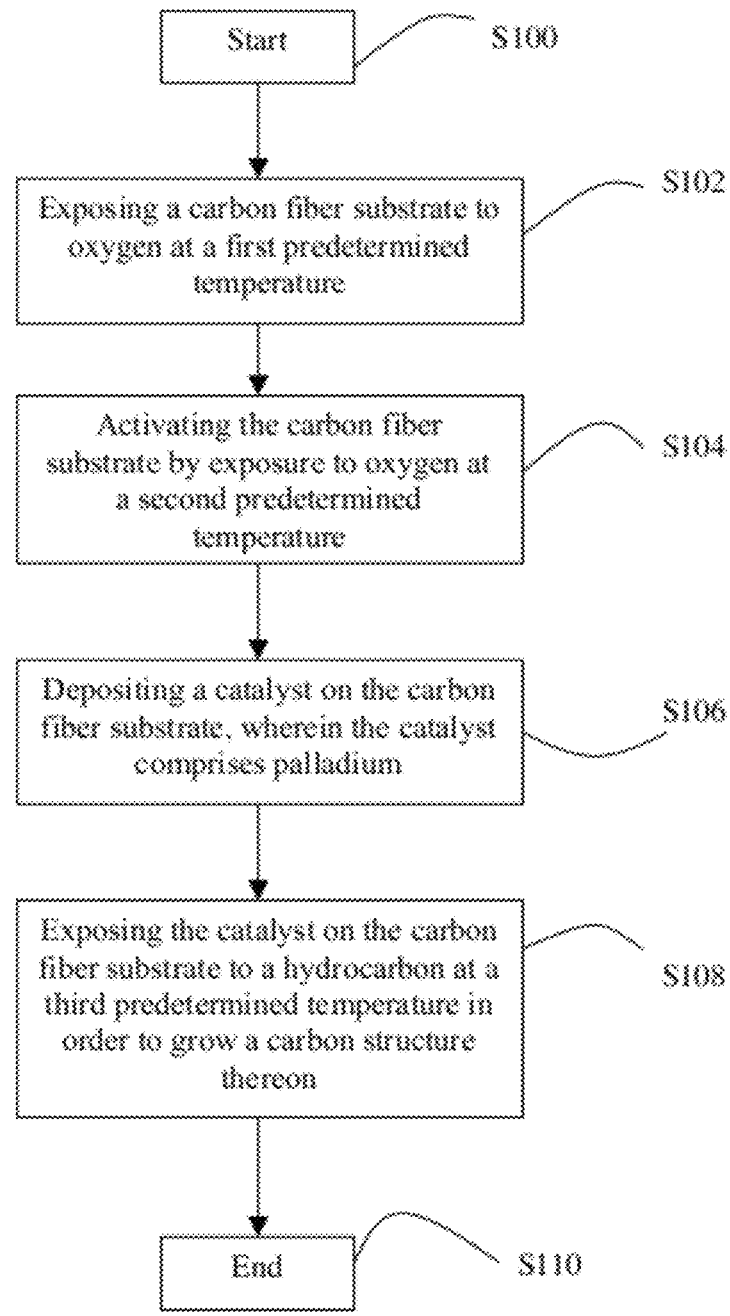
FIG. 1 is a flowchart depicting a method of the preferred embodiment in accordance with one aspect of the present invention.

As shown in FIG. 1, a method of the preferred embodiment includes exposing a carbon fiber substrate to oxygen at a first predetermined temperature as shown in block S102. Suitable carbon fiber substrates include, but are not limited to, pitch based carbon fiber, a PAN substrate, carbon nanofibers, carbon films, carbon foil, carbon fabric, carbon foam and/or carbon fiber bundles. Exposure of the carbon fiber substrate to oxygen functions to remove any unwanted materials from the substrate, including for example sizing materials that are commonly deposited on carbon fiber materials. In one variation of the method of the preferred embodiment, the method can further include rinsing the carbon fiber substrate with a solvent. Suitable solvents include, but are not limited to, organic or inorganic solvents such as water, acetone, methyl acetate, ethyl acetate, ethyl alcohol and/or ethanol. Block S104 of the method of the preferred embodiment recites activating the carbon fiber substrate by exposure to oxygen at a second predetermined temperature. Activation of the carbon substrate functions to roughen the surface of the carbon fiber itself and to promote growth of multimodal carbon nanostructures thereon. Specific features and advantages of the activation of the carbon substrate are described further herein with reference to the example embodiment and FIGS. 2A and 2B.

Block S106 of the method of the preferred embodiment recites depositing a catalyst on the carbon fiber substrate, wherein the catalyst comprises palladium. Other suitable catalysts can include, for example, cobalt, nickel, molybdenum, or any other transition metals, metal alloys, metal salts, and/or metal or alloy solutions. Suitable catalyst deposition methods include at least incipient wetness, sputtering deposition, and/or electrochemical deposition. The catalyst functions to promote the growth of the carbon nanostructures via the interaction between the catalyst particles and a carbon source, such as for example a hydrocarbon. Block S108 of the method of the preferred embodiment recites exposing the catalyst on the carbon fiber substrate to a hydrocarbon at a third predetermined temperature in order to grow a carbon structure thereon. Suitable hydrocarbons can include, but are not limited to, hydrocarbon gases such as acetylene, ethylene and methane or any combination thereof. As described further herein, the third predetermined temperature is significantly lower than those typically used in the growth of carbon nanostructures, and the growth process is conducted at or about atmospheric pressure.

In one variation of the method of the preferred embodiment, the first predetermined temperature is between 475 and 525 degrees Celsius. Alternatively, the first predetermined temperature can be approximately 500 degrees Celsius. As described in the example embodiment below, the first predetermined temperature can also be approximately 525 degrees Celsius. Even operating at these relatively low temperatures, the exposure to oxygen at the first predetermined temperature functions to remove and/or burn away any sizing or other non-essential materials from the surface of the carbon substrate.

In another variation of the method of the preferred embodiment, the second predetermined temperature can be between 500 and 550 degrees Celsius. Alternatively, the second predetermined temperature can be approximately 525 degrees Celsius. As noted further herein with reference to the example embodiment, the activation phase of the method of the preferred embodiment functions to alter the surface structure of the carbon substrate and promote interaction with the catalyst. As noted herein, the removal of the sizing and the activation of the carbon substrate can result in a net weight loss of the carbon substrate ranging between 10 and 15%.

In another variation of the method of the preferred embodiment, the third predetermined temperature is between 525 and 575 degrees Celsius. Alternatively, the third predetermined temperature can be approximately 550 degrees Celsius. Note that each phase of the method of the preferred embodiment can be performed at temperatures significantly less than those typically employed. In particular, for the decomposition of hydrocarbon molecules a temperature of 1000 degrees Celsius or greater is typical. However, the third predetermined temperature can be significantly less than that as noted above. Each of the first, second and third predetermined temperatures can be at or less than approximately 550 degrees Celsius. Alternatively, and all of the first, second and third predetermined temperatures can be within a variable range from 450 to 550 degrees Celsius. Moreover, the growth phase of the method of the preferred embodiment can be conducted at or near atmospheric pressure and in the presence of oxygen. Unexpectedly, as shown with reference to the example embodiment, the method of the preferred embodiment can be used to generate multimodal carbon nanostructures of differing sizes and shapes on the same carbon substrate and under the same growth conditions.

In another variation of the method of the preferred embodiment, the catalyst can be an aqueous solution including palladium nitrate. In one alternative, the aqueous solution can be $Pd(NO_3)_2 6H_2O$. One suitable method for administering the catalyst to the carbon fiber substrate is incipient wetness, which can include dipping, brushing or otherwise wetting the carbon fiber substrate with the catalyst material until a predetermined amount of catalyst is deposited thereon. Another variation of the method of the preferred embodiment can include heating the carbon fiber substrate and catalyst to a fourth predetermined temperature in the presence of a hydrogen/nitrogen mixture to decompose the nitrate. Suitable values for the fourth predetermined temperature range between 100 and 500 degrees Celsius, depending upon the time allotted for decomposition of the nitrate. Upon removal of the nitrate, pure palladium particles of a predetermined net weight remain on the surface of the carbon fiber substrate. In one variation of the method of the preferred embodiment, the catalyst is between 0.3 and 0.5% of the net weight of the carbon fiber substrate.

In another variation of the method of the preferred embodiment, exposing the catalyst on the carbon fiber substrate to a hydrocarbon at a third predetermined temperature can include flowing a gas mixture comprising nitrogen, oxygen and one of acetylene, ethylene or methane. As noted herein, the third predetermined temperature can be significantly lower than those typically employed in carbon growth systems. In one alternative, the gas mixture can include approximately 90% by volume $N_2$, approximately 5% by volume $O_2$, and approximately 5% by volume $C_2H_2$, $C_2H_4$, or $CH_4$. As noted further herein, various suitable hydrocarbons can be utilized as a carbon source. In the example embodiment described herein, ethylene ($C_2H_4$) is used as a hydrocarbon although other sources noted here can also be used. It is also noted that each of the first, second, third and fourth temperature ranges are substantially below those employed in typical carbon growth methods that operate at or above 1000 degrees Celsius. Moreover, it is noted that the carbon growth is performed in the presence of oxygen and at or near atmospheric pressures.

II. Example Embodiments

Reference is now made to FIGS. 2A, 2B, 3A, 3B, 3C, 4A, 4B, and 4C for a description of one example embodiment of the present invention. It should be understood that the following is disclosed in order to enable one of ordinary skill in the art to make and use the present invention, and should not be construed so as to limit or restrict the appended claims.

In the example embodiment, commercially available PAN carbon fibers were used as a carbon substrate on which the carbon nanostructures can be grown. An apparatus (not shown) for performing the example embodiment includes a standard furnace having an inlet and an exhaust and one or more mass flow controllers to selectively introduce one or more constituents into the furnace reactor. All reactions in the example embodiment are conducted at or near atmospheric pressure, obviating the need for any vacuum pumps or other equipment. As noted herein, the reactions in the example embodiment are conducted at or below 700 degrees Celsius. More particularly, the example method employs a temperature range below approximately 550 degrees Celsius throughout.

In the example embodiment described herein, the carbon substrate was treated in oxygen at a temperature of approximately 525 degrees Celsius for approximately 10 minutes. The treated carbon substrate was then rinsed in ethyl alcohol and dried in air at approximately 100 degrees Celsius for approximately 1 hour. In order to activate the carbon substrate, it was then "burned" in oxygen at approximately 525 degrees Celsius for approximately 20 minutes. The activating oxygen was flowed at approximately 100 standard cubic centimeters per minute (sccm). The treatment process resulted in a net weight reduction in the carbon substrate ranging between 10 and 15 percent.

Figure 2A:
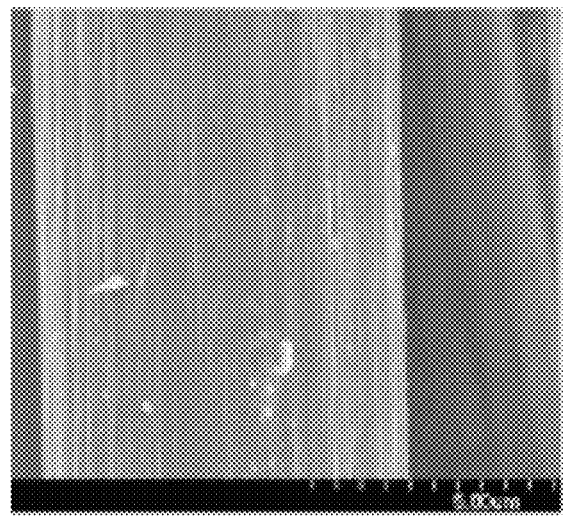
FIG. 2A is a scanning electron microscope image of a carbon fiber substrate prior to activation in accordance with an example embodiment of the present invention.
Figure 2B:
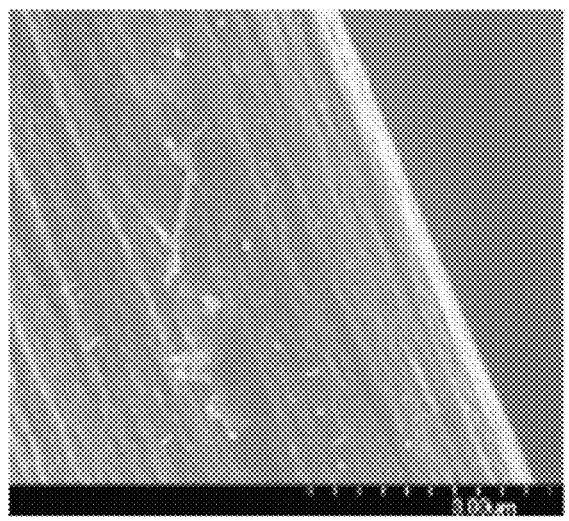
FIG. 2B is a scanning electron microscope image of a carbon fiber substrate after treatment in accordance with an example embodiment of the present invention.

As shown in FIGS. 2A and 2B, the removal of the sizing resulted in a carbon substrate surface that was slightly roughened and with a decreased diameter.

FIG. 2A is an image of a carbon fiber after the initial burn and rinse phases, showing that there are only fragments of sizing or other undesirable material thereon. The average diameter of the carbon fibers in this sample was approximately 7.4 micrometers. FIG. 2B shows a carbon fiber after the activation phase, showing a slight roughening of the surface and a decrease in the diameter of approximately 5%. There was no apparent change in the surface morphology of the carbon substrate, indicating no apparent damage to the carbon surface itself and therefore ensuring optimized catalyst dispersal and growth conditions.

In the example embodiment, the catalyst was deposited on the carbon fiber substrate via incipient wetness impregnation. The catalyst of the example embodiment was palladium, deposited in a palladium nitrate precursor solution ($Pd(NO_3)_2 6H_2O$). The amount of precursor salt, palladium nitrate hydrate, required for a final metal loading of 0.05, 0.5, 1, 5, 10 and 100 percent by weight was dissolved in ionized water. After depositing the catalyst material onto the carbon fiber substrate, they were left to dry at approximately 100 degrees Celsius for about 12 hours.

Decomposition of the catalyst precursor salt was accomplished in three stages, all of which were performed at ambient pressure. The carbon fiber substrate and catalyst were calcinated in an inert gas flowing at approximately 150 sccm at approximately 250 degrees Celsius for approximately 4 hours. A reducing gas of approximately 93% Argon and 7% Hydrogen was introduced at a temperature of approximately 550 degrees Celsius for approximately one hour. Nitrogen gas was also flowed for approximately one hour at 600 sccm at approximately 550 degrees Celsius. Each of these steps functioned to further reduce and uniformly disperse the palladium particles on the carbon fiber substrate.

Carbon nanostructure growth was accomplished in a fuel rich mixture of nitrogen, oxygen and ethylene. In particular, nitrogen was flown at approximately 300 sccm, oxygen at approximately 15 sccm and ethylene at approximately 15 sccm. The temperature of the system was maintained at approximately 550 degrees Celsius for variable growth intervals including 1, 5, 35, 90 and 270 minutes for different samples. The resultant hydrocarbon gas mixture was approximately 90% by volume $N_2$, approximately 5% by volume $O_2$, and approximately 5% by volume $C_2H_4$. Cooling the grown nanostructures included flushing the reactor with nitrogen at approximately 1000 sccm for an initial period of approximately two minutes followed by a reduced rate of approximately 50 sccm until the carbon nanostructures were substantially cooled.

Figure 3A:
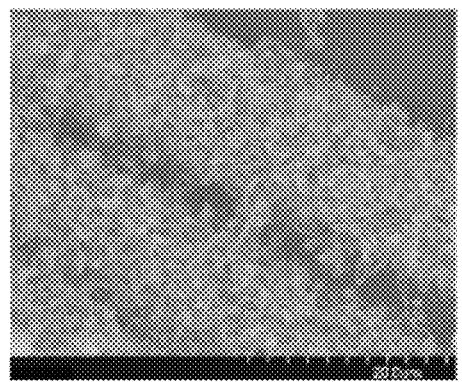
FIGS. 3A, 3B and 3C are scanning electron microscope images at varying magnifications of a carbon nanostructure grown on a carbon fiber substrate in accordance with an example embodiment of the present invention.
Figure 3B:
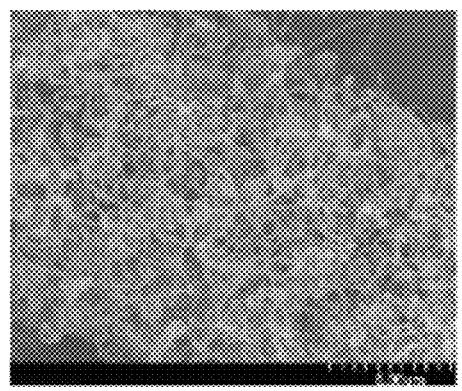
Figure 3C:
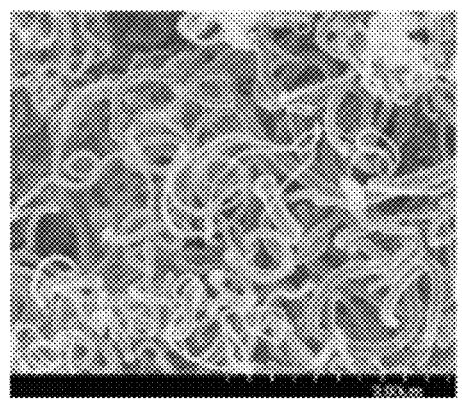
Figure 4A:
FIGS. 4A, 4B, and 4C are transmission electron microscope images at varying magnifications of a carbon nanostructure grown on a carbon fiber substrate in accordance with an example embodiment of the present invention.
Figure 4B:
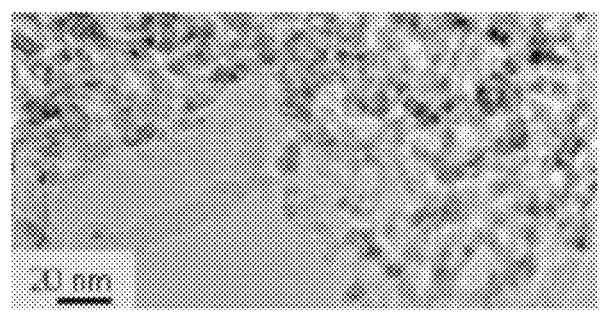
Figure 4C:

FIGS. 3A, 3B and 3C are scanning electron microscope (SEM) images of the carbon nanostructure grown on a carbon substrate in a gaseous mixture having an equal ratio of oxygen and ethylene, i.e. a gas mixture of approximately 90% by volume $N_2$, approximately 5% by volume $O_2$, and approximately 5% by volume $C_2H_4$. FIGS. 4A, 4B and 4C are transmission electron microscope (TEM) images of the carbon nanostructure growth in a gaseous mixture having an equal ratio of oxygen and ethylene, i.e. a gas mixture of approximately 90% by volume $N_2$, approximately 5% by volume $O_2$, and approximately 5% by volume $C_2H_4$.

Review of both the SEM and TEM images confirms that the example embodiment generates two types of carbon structures. There are a first set of smaller, more densely packed structures (type A) that have a mean diameter of approximately 5 nm as well as a set of larger, less densely packed structures (type B) that have a mean diameter ranging from approximately 50 to 150 nm. The resultant nanostructure is multimodal in nature, including the carbon fiber forming the substrate defining a micrometer scale carbon structure, the type B structures that include both nano- and submicron-scale carbon structures, and the type A structures that are nanostructures. The example embodiment generates carbon structure growth that is bimodal in nature including both the type A and type B structures that range between the nano- and submicron-scale carbon structures. It is also noted that the morphology of the carbon structures is not uniform, ranging from smooth surfaced rods to tight spirals and kinked geometries. As the nanostructures increase in length, a weave or lattice structure is formed creating yet another type of carbon nanostructure.

Other example embodiments confirmed that in the absence of oxygen during the growth phase, no fibers were detected. Further, on carbon substrates that were not activating in accordance with the principles set forth herein, substantially all of the growth was confined to the larger type B structures. Likewise, without the presence of a catalyst, no substantial growth of any type of structure could be evidenced. Variations in the metal loading from 0.5 to 100% by weight did not have any significant affect on the structure of the nanostructures grown, from which it is inferred that the lower metal loading value is as efficient as higher metal loading value at producing the types of structures depicted in FIGS. 3A, 3B, 3C, 4A, 4B, and 4C. Nevertheless, metal loading at 0.05% resulted in a larger proportion of the grown nanostructures to be of the type A variety as opposed to the type B variety.

The methods and variations thereof described herein provide a rapid, low temperature and low cost technique for generating carbon structures such as carbon nanotubes (CNTs) and carbon nanofilaments (CFTs) on carbon substrates. The methods and variations thereof described herein are functional at approximately one-fourth to one-third the operating temperature of alternative methods, which ensures the structural integrity and protection of the carbon substrate. Uses for the structures realizable from the methods and variations described herein include the integration of surface grown CNT/CFT structures into polymer composites which in turn can result in the next generation of structural composites with ultra high strength, fracture resistance and deformability while increasing the shear strength of fiber reinforced polymers.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises" and/or "comprising," when used in this specification, specify the presence of the stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements and specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical applications, and to enable others of ordinary skill in the art to understand the invention for various embodiments with various modifications as are suited to the particular use contemplated.

What is claimed is:

1. A method of manufacturing a carbon structure comprising:
 exposing a carbon fiber substrate to oxygen at a first predetermined temperature;
 activating the carbon fiber substrate by exposure to oxygen at a second predetermined temperature;
 depositing a catalyst on the activated carbon fiber substrate, wherein the catalyst comprises palladium; and
 exposing the catalyst on the carbon fiber substrate to a hydrocarbon at a third predetermined temperature in order to grow a carbon structure thereon.

2. The method of claim 1, further comprising rinsing the carbon fiber substrate with a solvent prior to the activating step.

3. The method of claim 1, wherein the carbon fiber substrate comprises one of polyacrylonitrile fibers, pitch based carbon fibers, carbon nanofibers, carbon films, carbon foil, carbon fabric, carbon foam or carbon fiber bundles.

4. The method of claim 1, wherein the first predetermined temperature is between 475 and 525 degrees Celsius.

5. The method of claim 4, wherein the first predetermined temperature is approximately 500 degrees Celsius.

6. The method of claim 1, wherein the second predetermined temperature is between 500 and 550 degrees Celsius.

7. The method of claim 6, wherein the second predetermined temperature is approximately 525 degrees Celsius.

8. The method of claim 1, wherein the third predetermined temperature is between 525 and 575 degrees Celsius.

9. The method of claim 8, wherein the third predetermined temperature is approximately 550 degrees Celsius.

10. The method of claim 1, wherein the first, second and third predetermined temperatures are less than 575 degrees Celsius.

11. The method of claim 1, wherein the depositing step comprises administering an aqueous solution comprising palladium nitrate to the activated carbon fiber substrate.

12. The method of claim 11, further comprising heating the carbon fiber substrate and the palladium nitrate to a fourth predetermined temperature in the presence of a hydrogen/nitrogen mixture to decompose the nitrate.

13. The method of claim 12, wherein the fourth predetermined temperature is approximately 400 degrees Celsius.

14. The method of claim 12, wherein the palladium comprises between 0.3 and 0.5% of the net weight of the carbon fiber substrate after the heating step at the fourth predetermined temperature.

15. The method of claim 1, wherein exposing the catalyst on the carbon fiber substrate to a hydrocarbon at a third predetermined temperature comprises flowing a gas mixture comprising nitrogen, oxygen and one of acetylene, ethylene or methane, and the acetylene, ethylene or methane is a carbon source for growing the carbon structure.

16. The method of claim 15, wherein the gas mixture comprises approximately 90% by volume $N_2$, approximately 5% by volume $O_2$, and approximately 5% by volume $C_2H_4$.

17. A method for generating multiscale carbon-carbon structures, the method comprising:
 exposing a polyacrylonitrile fiber substrate to oxygen at a temperature ranging between 475 and 525 degrees Celsius;
 depositing a palladium catalyst on the polyacrylonitrile fiber substrate, the depositing comprising administering an aqueous solution comprising dissolved palladium nitrate to the polyacrylonitrile fiber substrate;
 decomposing the nitrate thereby leaving substantially pure palladium particles as the palladium catalyst on the polyacrylonitrile fiber substrate;
 and
 exposing the palladium catalyst deposited on the polyacrylonitrile fiber substrate to a hydrocarbon at a temperature ranging between 525 and 575 degrees Celsius in order to grow a carbon structure thereon.

18. The method of claim 17, wherein the substantially pure palladium particles are between 0.3 and 0.5% of the net weight of the polyacrylonitrile fiber substrate and wherein the palladium catalyst is exposed to the hydrocarbon by exposing the palladium catalyst to a gas mixture comprising of nitrogen, oxygen and one of acetylene, ethylene or methane.

19. A method for generating multiscale carbon-carbon structures, the method comprising:
 exposing a polyacrylonitrile fiber substrate to oxygen at a temperature ranging between 475 and 525 degrees Celsius;
 rinsing the polyacrylonitrile fiber substrate in a solvent;
 activating the polyacrylonitrile fiber substrate by exposure to oxygen at a temperature ranging between 500 and 550 degrees Celsius;
 depositing a palladium catalyst on the activated polyacrylonitrile fiber substrate, the depositing comprising administering an aqueous solution comprising palladium nitrate to the activated polyacrylonitrile fiber substrate;
 decomposing the nitrate thereby leaving, substantially pure palladium particles as the palladium catalyst on the polyacrylonitrile fiber substrate the substantially pure palladium particles are between 0.3% and 0.5% of the net weight of the polyacrylonitrile fiber substrate; and
 exposing the substantially pure palladium particles on the polyacrylonitrile fiber substrate to a gas comprising ethylene at a temperature ranging between 525 and 575 degrees Celsius in order to grow a carbon structure thereon.

* * * * *

UNITED STATES PATENT AND TRADEMARK OFFICE
CERTIFICATE OF CORRECTION

Page 1 of 1

PATENT NO.         : 8,277,872 B1
APPLICATION NO.    : 12/617617
DATED              : October 2, 2012
INVENTOR(S)        : Marwan S. Al-Haik et al.

It is certified that error appears in the above-identified patent and that said Letters Patent is hereby corrected as shown below:

In the Specification

Column 1, lines 9-12 should read as follows:

The present invention was made with Government support under Grant No. HDTRA1-08-1-0017 from the Defense Threat Reduction Agency and Grant No. DE-AC52-06NA25396 DOE/NNSA from the Los Alamos National Laboratory. The U.S. Government has certain rights in this invention.

Signed and Sealed this
Twenty-fifth Day of November, 2014

Michelle K. Lee
*Deputy Director of the United States Patent and Trademark Office*